United States Patent [19]

Sasaki et al.

[11] Patent Number: 5,382,838
[45] Date of Patent: Jan. 17, 1995

[54] DIGITAL DRIVER WITH CLASS AB OUTPUT STAGE

[75] Inventors: Lawrence H. Sasaki, Manotick; Anthony K. D. Brown, Kanata, both of Canada

[73] Assignee: Northern Telecom Limited, Montreal, Canada

[21] Appl. No.: 33,221

[22] Filed: Mar. 18, 1993

[51] Int. Cl.$^6$ .............. H03K 3/01; H03K 5/01; H03K 17/60; H03K 19/08

[52] U.S. Cl. ................. 327/108; 327/170; 327/333; 326/83

[58] Field of Search ............. 307/264, 268, 263, 270; 330/274

[56] References Cited

U.S. PATENT DOCUMENTS

| | | | |
|---|---|---|---|
| 4,121,203 | 10/1978 | Edwards et al. | 307/270 |
| 4,191,898 | 3/1980 | Ulmer | 307/264 |
| 4,571,506 | 2/1986 | Lisco | 307/270 |
| 4,587,491 | 5/1986 | Koterasawa | 330/274 |
| 5,028,824 | 7/1991 | Young | 307/268 |
| 5,070,255 | 12/1991 | Shin | 307/264 |
| 5,214,316 | 5/1993 | Nagai | 307/264 |

*Primary Examiner*—William L. Sikes
*Assistant Examiner*—Fetsum Abraham
*Attorney, Agent, or Firm*—Dallas F. Smith

[57] ABSTRACT

A low power (10 mW), high-speed (50 Mb/s) digital driver is formed from three analogue components: level shifter to limit the output swing, waveshaper to limit the slew-rate of the output transition, and a Class AB output stage to buffer the signal. The components afford flexibility to meet the demands of different applications. The driver can be limited to 1V swing for terminated applications such as for backplanes, or it can be limited to 1V swing for unterminated applications such as intraboard (PCB) communication.

8 Claims, 2 Drawing Sheets

DIGITAL DRIVER WITH CLASS AB OUTPUT STAGE

This invention relates to digital drivers and is particularly concerned with a digital driver having Class AB output stage.

Reference is directed to a copending U.S. patent application filed on the same day as this application and entitled "Quasi-differential Bus", Ser. No. 33,222, by Paul A. Langner, the entire disclosure of which is hereby incorporated by reference.

BACKGROUND OF THE INVENTION

A key component of modern high-speed digital systems, having many interconnected digital chips, is the transceiver which includes a driver and a receiver. With increased circuit density and speed, the performance of the driver is crucial to the success of the system. To provide good performance several criteria must be met. These include providing adequate timing margin, maintaining good signal integrity, introducing low electromagnetic interference (EMI) emissions, providing low noise with low cross-talk, and consuming low power. Preferably, the driver is single-end rather than differential thereby providing reduced pin count and potential for reduced power dissipation.

Existing digital driver designs meet some but not all of the above-identified criteria. Typical CMOS drivers have a voltage swing from rail-to-rail. Consequently CMOS drivers tend to be noisy and exhibit very high power dissipation with capacitive loads which are even a moderate level. Typical TTL drivers have a smaller voltage swing than CMOS drivers, however the swing is uncontrolled and consequently power dissipation varies considerably. For both CMOS and TTL drivers, even with slew-rate control, EMI emissions are relatively high and timing margins are inadequate for many applications. Many of the criteria are met by typical ECL drivers. ECL drivers are analog in nature and have controlled output voltage swing and output impedance. With slew-rate control, ECL drivers offer good timing margins, good signal integrity, and introduce little noise. ECL drivers have differential outputs which introduce low EMI emissions and allow for low cross-talk. ECL drivers use a Class A output stage, consequently power dissipation is relatively high.

SUMMARY OF THE INVENTION

An object of the present invention is to provide an improved digital driver.

In accordance with the present invention there is provided a digital driver circuit comprising: an input for receiving an input signal; an output for providing an output signal; first and second supply potential terminals; an input stage connected to the input for level shifting the input signal value to a predetermined value; a transconductance operational amplifier having a slew-rate limited output for shaping the level shifted signal; and a Class AB amplifier output stage for buffering the shaped, level-shifted signal.

BRIEF DESCRIPTION OF THE DRAWINGS

The present invention will be further understood from the following description with reference to the drawings in which.

DETAILED DESCRIPTION

Figure 1A:
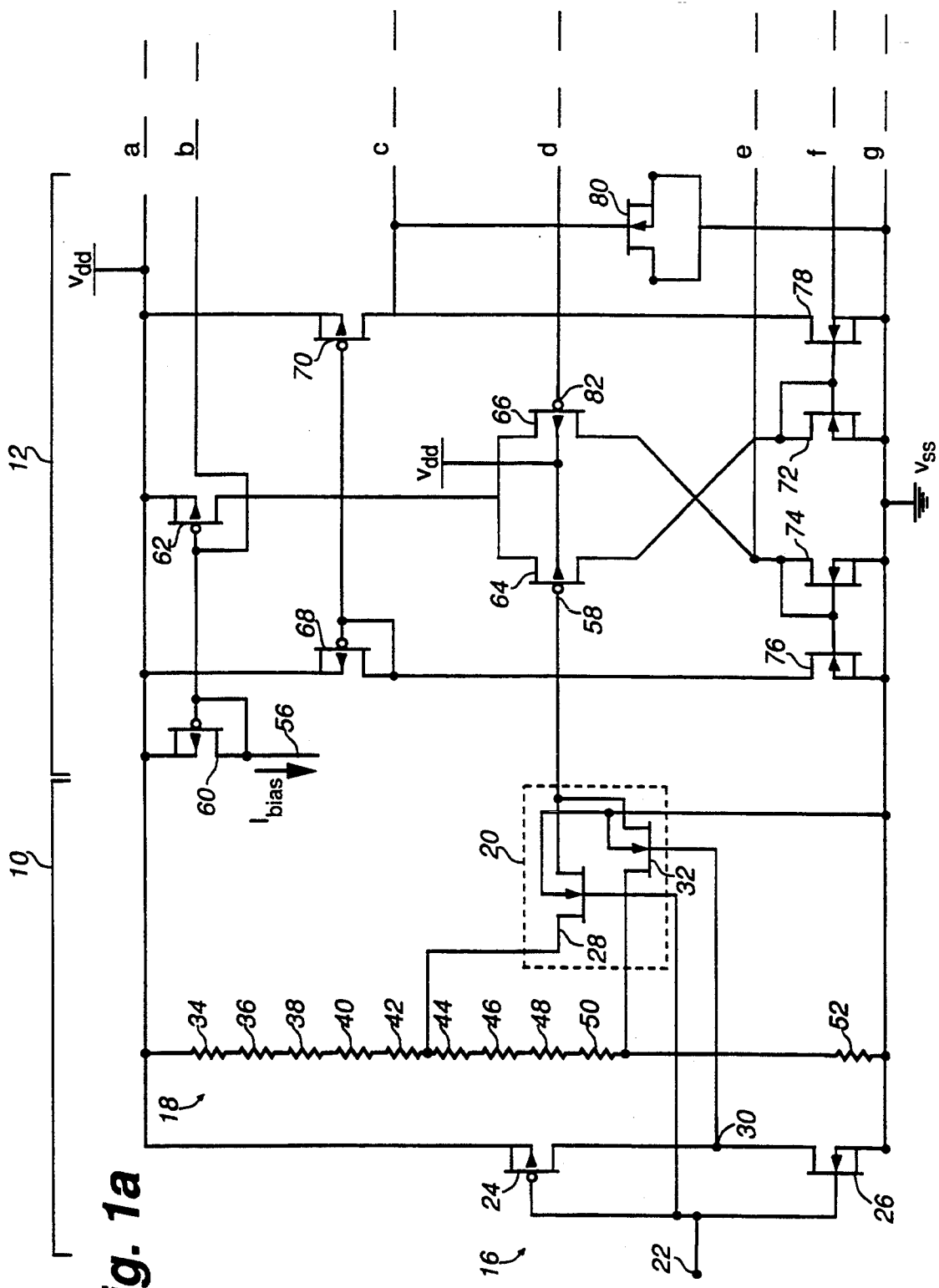
FIGS. 1a and 1b schematically illustrate a digital driver having Class AB output stage in accordance with an embodiment of the present invention.
Figure 1B:
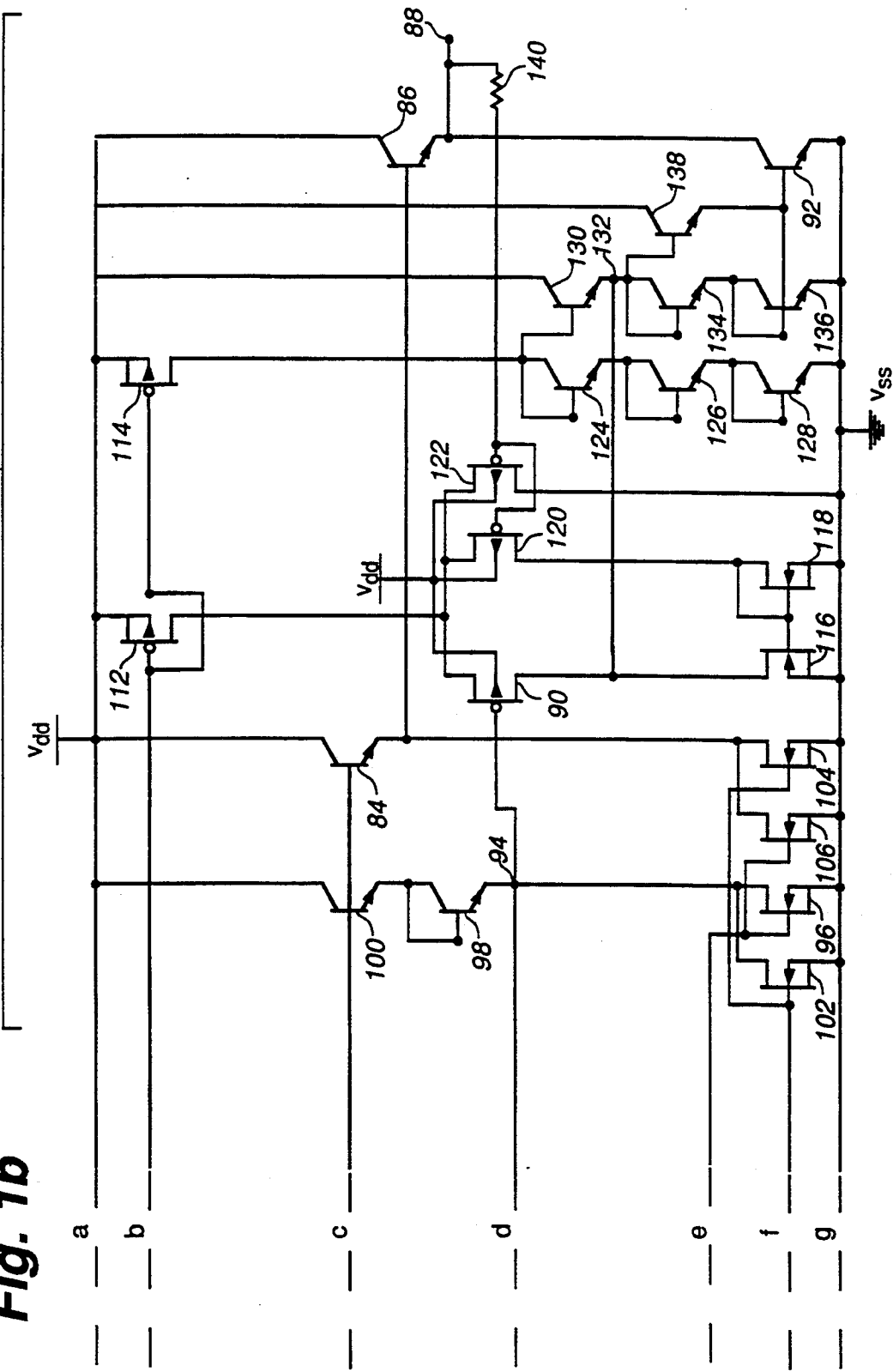

Referring to FIGS. 1a and 1b, there is schematically illustrated a digital driver having Class AB output stage in accordance with an embodiment of the present invention. The digital driver includes a level shifter 10, an operational transconductance amplifier 12, and an output stage 14.

The level shifter 10 includes a CMOS inverter 16, a resistor chain 18, and an NMOS switch 20. An input 22 to the CMOS inverter 16 is connected to the gates of PMOS and NMOS FETs 24 and 26. The input 22 is also connected to a first NMOS FET switch 28 of NMOS switch 20 via its gate. An output 30 of CMOS inverter 16 is connected to the drains of PMOS FET 24 and NMOS FET 26. The output 30 is also connected to a second NMOS FET switch 32 of NMOS switch 20 via its gate. The resistor chain 18 includes ten resistors 34 through 52, series connected between $V_{dd}$ and $V_{ss}$. The NMOS switch 20, which includes the NMOS switch FETs 28 and 32, has an output 54. The output 54 is connected to the source of NMOS switch FETs 28 and 32. The drains of NMOS switch FETs 28 and 32 are connected to junctions between resistors 42 and 44 and 50 and 52, respectively. Thus, the drain of NMOS switch FET 28 is held midway between $V_{dd}$ and $V_{ss}$ and the drain of NMOS switch FET 32 is held at one-tenth the voltage difference between $V_{dd}$ and $V_{ss}$ above $V_{ss}$. The gates of NMOS switch FETs 28 and 32 are connected to the input 22 of the CMOS inverter 16 and the output 30 of CMOS inverter 16, respectively. The substrate of NMOS switch FETs 28 and 32 is connected to $V_{ss}$.

The operational transconductance amplifier 12 includes an input 56 for bias current $I_{bias}$ and an input 58 connected to the output 54 of NMOS switch 20. The operational transconductance amplifier 12 includes PMOS FETs 60, 62, 64, 66, 68, and 70 and NMOS FETs 72, 74, 76, 78, and 80. PMOS FETs 60 and 68 and NMOS FETs 72 and 74 have their gates connected to their drains. Sources of PMOS FETs 60 and 62 are connected to $V_{dd}$. The gate of PMOS FET 60 is connected to the gate of PMOS FET 62. The drain of PMOS FET 62 is connected to the sources of PMOS FETs 64 and 66. The drains of PMOS FETs 64 and 66 are connected to $V_{ss}$ via NMOS FETs 72 and 74, respectively. The substrate of PMOS FETs 64 and 66 is connected to $V_{dd}$. The PMOS FET 68 has its source connected to $V_{dd}$ and its drain connected to the drain of NMOS FET 76. The source of NMOS FET 76 is connected to $V_{ss}$. Similarly, the PMOS FET 70 has its source connected to $V_{dd}$ and its drain connected to the drain of NMOS FET 78. The source of NMOS FET 78 is connected to $V_{ss}$. The gate and the drain of PMOS FET 68 are interconnected and are connected to the gate of PMOS FET 70. The gate of NMOS FET 76 is connected to the gate of NMOS FET 74. The gate of NMOS FET 78 is connected to the gate of NMOS FET 72. The input 58 to the transconductance amplifier is connected to the gate of PMOS FET 64. A second input 82 is connected to the gate of PMOS FET 66. The second input 82 accepts feedback from the output stage 14. The NMOS FET 80 has its drain and source connected together so that it acts as a capacitance. The gate of NMOS FET 80 is connected to the drains of PMOS FET 70 and NMOS FET 78. The source and drain of NMOS FET 80 are connected to $V_{ss}$.

The output stage 14 is a BiCMOS Class AB amplifier. The pull-up section of the amplifier is provided by a Darlington pair of bipolar NPN transistors 84 and 86. The base of transistor 84 is connected to the gate of NMOS FET 80. The emitter of transistor 86 is connected to an output 88 of the output stage 14. The pull-down section of the amplifier is provided by a pseudo-Darlington pair consisting of PMOS FET 90 and bipolar NPN transistor 92. The gate of PMOS FET 90 is connected to the gate of PMOS FET 66 of the transconductance amplifier 12 via a node 94. The node 94 is also the junction between the drain of an NMOS FET 96 and the emitter of a bipolar NPN transistor 98. The NMOS FET 96 has its source connected to $V_{ss}$, and its gate connected to the drain of NMOS FET 74 of the operational transconductance amplifier 12. The transistor 98 has its collector and base connected together which in turn are connected to the emitter of a bipolar NPN transistor 100. The collector and base of transistor 100 are connected to $V_{dd}$ and the gate of PMOS FET 80, respectively.

The node 94 is also connected to the drain of an NMOS FET 102 whose gate is connected to the gate of NMOS FET 78. The gate of NMOS FET 102 is also connected to the gate of an NMOS FET 104 whose drain is connected to the emitter of transistor 84 and the drain of an NMOS FET 106. The gate of NMOS FET 106 is connected to the gate of NMOS FET 96. Sources of NMOS FETs 102, 104, and 106 are connected to $V_{ss}$.

The biasing resistance provided via the gate of PMOS FET 60 is connected to gates of PMOS FETs 112 and 114. The source and drain of PMOS FET 112 are connected to $V_{dd}$ and the source of PMOS FET 90, respectively. The drain of PMOS FET 90 is connected to the drain of an NMOS FET 116. The source and gate of NMOS FET 116 are connected to $V_{ss}$ and the gate of an NMOS FET 118 whose source is connected to $V_{ss}$ and gate and drain are interconnected. The drain of PMOS FET 112 is also connected to sources of PMOS FETs 120 and 122. The drain of PMOS FET 120 is connected to the drain of NMOS FET 118. The drain of PMOS FET 122 is connected to $V_{ss}$. The substrate of PMOS FETs 90, 120 and 122 is connected to $V_{dd}$. Three bipolar NPN transistors 124, 126 and 128, each having its base and collector interconnected, are series connected between the drain of PMOS FET 114 and $V_{ss}$. A bipolar NPN transistor 130 has its collector connected to $V_{dd}$, its base connected to the collector of transistor 124 and its emitter connected to a node 132, which is in turn connected to the drain of PMOS FET 90. Two bipolar NPN transistors 134 and 136, each having its base and collector interconnected, are series connected between the node 132 and $V_{ss}$. A bipolar NPN transistor 138 has its collector connected to $V_{dd}$, its base connected to the collector of transistor 134 and its emitter connected to both the base of transistor 92 and the base of transistor 136.

In operation, the level shifter 10 uses taps on the resistor chain 18 to select the desired output levels. Desired output levels can be changed by using different taps from the resistor chain 18.

The operational transconductance amplifier 12 behaves as a slew-rate limited voltage follower, adding a trapezoidal slew limited shaping to the level shifted waveform output by the level shifter 10. The slew-rate is governed by the bias current $I_{bias}$ integrating in the capacitance provided by the NMOS FET 80. When the voltage at the gate of PMOS FET 64 is stable, the current in PMOS FET 64 and 66 are balanced and the voltage on the NMOS FET 80 remains steady. When the voltage at the gate of PMOS FET 64 changes, the current in PMOS FETs 64 and 66 is unbalanced and current sinks from or sources to the NMOS FET 80 thereby changing the voltage across it. This voltage is applied to the bases of transistors 100 and 84.

In the output stage, transistors 100 and 98 provide a positive bias for the Darlington pair 84 and 86. When the voltage on NMOS FET 80 changes, the voltage on transistor 98 changes accordingly and the voltage at the output of transistor 86 follows that at the gate of PMOS FET 66. The pull-down is essentially a pseudo-Darlington comprising PMOS FET 90 and NPN transistor 92. PMOS FET 122 is chosen to set the quiescent biasing of the output state. PMOS FET 120 steals current from the transistor 92 thereby reducing the quiescent current and lowering overall power consumption. PMOS FET 114 and transistors 124, 126, 128, and 130 provide bias to the composite NPN device consisting of NPN transistors 134, 136, 138, and 92. The composite device is used to obtain better control over current gain.

The application for the driver of FIG. 1 is unterminated intraboard communication. This configuration dissipates minimum power. The output stage requires no termination impedance and is able to accommodate capacitive loads. The driver can be readily adapted for other applications. For example, by removing NMOS FET 24 the quiescent current is increased as required for terminated interboard applications. With the active pull-down circuit, termination resistor can be referenced to any voltage between the low and high levels to reduce total power consumption. Removing the NMOS switch 20 to fix the output voltage would provide a reference voltage for pseudo-differential operation as required in the above referenced copending application.

The output stage 14 can be implemented with pseudo-Darlington pull-up and pull-down. The level shifter 10 and the transconductance operational amplifier 12 can be implemented using bipolar devices. In this implementation, the level shifter 10 would have a different configuration, for example, using current steering to a reference resistor to set the level. The transconductance operational amplifier 12 merely substitutes PNP transistors for PMOS FETs and NPN transistors for NMOS FETs.

This invention addresses all of the criteria. Both signal swing and slew-rate are tightly controlled yielding low variation in propagation delay and hence adequate timing margins. Using a Class AB output stage, this invention provides a controlled output impedance, giving good signal integrity with low power dissipation. Also since termination impedance is not required to provide pull-up or pull-down current, the driver is suitable for unterminated applications. Noise performance particularly ground noise, although not as good as ECL with its Class A output stage, is superior to typical CMOS and TTL drivers. EMI emissions are comparable with those for ECL drivers. The differential outputs of ECL drives have the potential for lower EMI emissions, however in circuit board applications an adequate ground plane mitigates any differences while in backplane applications, connectors tend to radiate thereby compromising the balanced nature of the ECL driver and negating its inherent advantage over a single-ended driver.

Numerous modifications, variations and adaptations may be made to the particular embodiments of the invention described above without departing from the scope of the invention, which is defined in the claims.

What is claimed is:

1. A digital driver circuit comprising:
   an input for receiving an input signal;
   an output for providing an output signal;
   first and second supply potential terminals;
   an input stage connected to the input for level shifting the input signal value to a predetermined value;
   a transconductance operational amplifier having a slew-rate limited output for shaping the level shifted signal;
   a Class AB amplifier output stage for buffering the shaped, level-shifted signal;
   the input stage includes a resistor chain connected between first and second supply potential terminals and selector means having first and second taps along the resistor chain for providing two predetermined values for level shifting in dependence upon the input signal; and
   the selector means includes a CMOS inverter connected to the input for receiving the input signal and first and second NMOS switches connected to the first and second taps, respectively and the CMOS inverter input and output, respectively for control thereof.

2. A circuit as claimed in claim 1 wherein the output stage is BiCMOS.

3. A circuit as claimed in claim 2 wherein the output stage includes a Darlington pull-up and a pseudo-Darlington pull-down.

4. A circuit as claimed in claim 3 wherein the pseudo-Darlington pull-down includes a PMOS FET having its source connected to the second supply potential terminal via an NMOS FET for providing a first quiescent current.

5. A circuit as claimed in claim 4 wherein the source of the PMOS FET is connected directly to the second supply potential terminal for providing a second quiescent current higher than the first quiescent current.

6. A circuit as claimed in claim 5 wherein the source of the PMOS FET is connected directly to the second supply potential terminal for providing a second quiescent current higher than the first quiescent current.

7. A circuit as claimed in claim 2 wherein the output stage includes a pseudo-Darlington pull-up and a pseudo-Darlington pull-down.

8. A circuit as claimed in claim 7 wherein the pseudo-Darlington pull-down includes a PMOS FET having its source connected to the second supply potential terminal via an NMOS FET for providing a first quiescent current.

* * * * *